(12) United States Patent
Ryum et al.

(10) Patent No.: US 6,190,984 B1
(45) Date of Patent: Feb. 20, 2001

(54) METHOD FOR FABRICATING OF SUPER SELF-ALIGNED BIPOLAR TRANSISTOR

(75) Inventors: Byung-Ryul Ryum; Deok-Ho Cho; Tae-Hyeon Han; Soo-Min Lee; Kwang-Eui Pyun, all of Daejeon (KR)

(73) Assignees: Electronics and Telecommunications Research Institute, Daejeon; Korea Telecommunication Authority, Seoul, both of (KR)

( * ) Notice: Under 35 U.S.C. 154(b), the term of this patent shall be extended for 0 days.

(21) Appl. No.: 09/229,831

(22) Filed: Jan. 13, 1999

Related U.S. Application Data

(63) Continuation of application No. 08/758,256, filed on Nov. 27, 1996, now abandoned.

(51) Int. Cl.$^7$ ................................................. H01L 21/8222
(52) U.S. Cl. ............................ 438/309; 438/31; 438/309
(58) Field of Search ................................ 438/31, 32, 126, 438/127, 131, 132, 90

(56) References Cited

U.S. PATENT DOCUMENTS 5,424,227  * 6/1995  Dietrich et al. .................... 438/31
5,434,092    7/1995  Neudeck et al. .
5,484,737    1/1996  Ryum et al. .
5,496,745    3/1996  Ryum et al. .
5,620,907    4/1997  Jalali-farahani et al. .
5,633,179    5/1997  Kamins et al. .

* cited by examiner

Primary Examiner—David Nelms
Assistant Examiner—Dung A Le
(74) Attorney, Agent, or Firm—Antonelli, Terry, Stout & Kraus, LLP

(57) ABSTRACT

The invention relates to a method for manufacturing a super self-aligned heterojunction bipolar transistor which is capable of miniaturizing an element, simplifying the process step thereof by employing a selective collector epitaxial growth process without using a trench for isolating between elements. According to the invention, isolation between elements is derived by using a mask defining an emitter region and a second spacer. The base layer has multi-layer structure being made of a Si, an undoped SiGe, a SiGe doped a p-type impurity in-situ and Si. Also, the selective epitaxial growth for a base is not required. Thus, it can be less prone to a flow of leakage current or an emitter-base-collector short effect.

15 Claims, 5 Drawing Sheets

METHOD FOR FABRICATING OF SUPER SELF-ALIGNED BIPOLAR TRANSISTOR

This is a continuation of application Ser. No. 08/758,256, filed Nov. 27, 1996 now abandoned.

FIELD OF THE INVENTION

The present invention relates to a super self-aligned bipolar transistor and method for fabricating thereof and, more particularly, to a super self-aligned heterojunction bipolar transistor and method for manufacturing thereof through the use of a selective collector epitaxial growth process.

BACKGROUND OF THE INVENTION

In general, even if the prior art element has an improved operating speed in proportion to miniaturization of a homojunction bipolar transistor, since, to accomplish this, an impurity concentration between emitter and base should be increased, enhancement of characteristics thereof based on a structure of such element is a difficult task.

There have been proposed a heterojunction bipolar transistor to cope with the above disadvantage.

Such heterojunction bipolar transistor has a characteristics that energy bandgap of an emitter is larger than that of a base. For this reason, utilizations of the heterojunction bipolar transistor showed an improvement of the performance of element and various design effects in comparison to the homojunction bipolar transistor. In addition, in the manufacturing process associated with the homojunction bipolar transistor previously described, there have been developed a method of decreasing the energy bandgap by adding germanium to a base layer composed of silicon.

As a conventional homojunction silicon bipolar transistor, the prior art heterojunction bipolar transistors utilizes a polysilicon thin film as both a base electrode and a impurity diffusion source for an emitter.

Thus, using Ge instead of Si on the base layer, a difference between an energy bandgap of the emitter and that of the base is occurred to increase an emitter implantation efficiency, then the base is grown to a high doping concentration ultra-thin film, thereby enhancing a current gain and a switching speed of element.

Recently, according as the optimization and the miniaturization of the structure of element, there have being utilized various methods to minimize several parasitic components such as a base resistance causing at an active region of the element and a parasitic capacity causing between a collector and a base.

Examples of such various methods is a trench isolation, a local oxidation of silicon ("LOCOS"), a selective epitaxial growth ("SEG") of a SiGe base thin film, and a selective epitaxial growth for a Si emitter and so on.

Using the above methods, there have being developed a super self-aligned Si/SiGe heterojunction bipolar transistor which self-aligned between base and emitter to reduce a base parasitic resistance, or self-aligned both between base and emitter, and between collector and base.

Furthermore, in order to further reduce the base parasitic resistance resulting from the poly-silicon thin film forming a base electrode material, developments of manufacture process using as the base electrode a metallic thin film for example titanium silicide, instead of the polysilicon thin film have being performed.

The above local oxidation of silicon method has a shortcoming that a bird's beak is horizontally formed as a thickness of silicon thermal oxidation film, resulting in a limitation of geometric reduction of the element.

There are shown in FIG. 1 an exemplary super self-aligned Si/SiGe heterojunction bipolar transistor which utilizes the selective epitaxial growth method for a SiGe base thin film without using the LOCOS method.

Referring to FIG. 1, there are shown a cross-sectional view of npn Si/SiGe heterojunction bipolar transistor which self-aligned between collector and base by using the selective base epitaxial growth previously described, after the growth of a base thin film.

An $n^+$ buried silicon collector layer (1-2) is first formed on a p-type silicon substrate (1-1), and an n-silicon collector layer (1-3) is then grown on the buried collector layer (1-2).

Subsequently, a collector junction portion (1-4) is formed by implanting an n-type impurity ion thereon, and then a trench to isolate between elements is formed by a dry etching method, and, in turn, filling therein with Boron Phosphorous Silica Glass ("BPSG") insulating thin film (1-5) made of boron B and phosphorous P. The BPSG insulating thin film (1-5) is then flatted under a high pressures.

In an ensuing step, an insulating film (1-6), a $P^+$ polysilicon film (1-7), an insulating film (1-8) and a side-wall insulating film (1-9) are formed by depositing and etching methods as shown in FIG. 1, and an n-type collector region (1-10) for enhancing characteristics of elements in a high current region is then formed by selectively ion implanting to only an active region of the element.

In a subsequent step, a SiGe base layer (1-11) is selectively grown on only an exposed portion in the collector region (1-10) and the polysilicon film (1-7), through the use of Gas Source Molecular Beam technique, and then a polysilicon film (1-12) is selectively grown on the remaining space, thereby accomplishing junction between the polysilicon film (1-7) for a base electrode and the SiGe base layer (1-11).

Accordingly, self-alignment between the collector and the base can be performed, since a parasitic capacity region formed between the collector and the base is not defined as a photoresist and is limited only portion of a polysilicon thin film (1-12).

Since, however, the parasitic capacity region defined by the polysilicon thin film (1-12) is determined from a horizontal wet etching for the insulating film (1-6), resulting in the degradation of efficiency of process in an uniformity and a reproduction aspects, thus entailing the fatal degradation of the performance of element.

In addition, the prior art method has a disadvantage that since the low speed selective epitaxial growth method is applied two times during the growth of the SiGe base layer (1-11) and the poly-silicon thin film (1-12), and two thin film for example, the SiGe base (1-11) and the polysilicon (1-12), are used during the growth process thereof, resulting in a complicated manufacture process, and further even if the polysilicon thin film (1-12) is slightly grown on the base layer (1-11), it is allow to cause the fatal degradation of element performance, thereby making it difficult to control the process thereof. Thus, the prior art method is difficult to accomplish an effective manufacturing process and a simplified process step.

Furthermore, as shown in FIG. 1, the prior art method has a shortcoming that a trench structure for isolating between elements should be deeply formed so as to prevent the collector junction portion (1-4) from contacting between elements via the n⁻ collector thin film (1-3) on the n⁺ buried Si collector layer (1-2) formed at the entire surface of a substrate, resulting in a larger space requirement to fill with the insulating thin film (1-5), thus entailing a bulkier element.

Tuning now to FIG. 2, there are presented a cross-sectional view of Si/SiGe heterojunction bipolar element manufactured by another method previously described, after the growth of a base thin film.

In the prior art exemplary shown in FIG. 2, both of the base and the collector thin films are grown through the use of selective epitaxial growth method in contrast with the trench structure previously described, to thereby accomplish a simplified and an integrated manufacture processes.

As shown in FIG. 2, an n⁺-type collector (2-2) is first formed on a p-type substrate (2-1), and then an insulating thin film (2-3) and a polysilicon thin film (2-4) for a base electrode are sequently deposited thereon, thereafter, a base electrode region is defined by a photoresist mask and etching the poly-silicon thin film (2-4).

After the above step, a insulating thin film (2-5) is deposited thereon, and then the photoresist mask, the insulating thin film (2-5), the poly-silicon thin film (2-4) and the insulating thin film (2-3) are defined as an active region by etching process.

Subsequently, an n-type silicon layer (2-6) for a collector, a SiGe layer (2-7) for a base, and a silicon layer (2-8) for an emitter are sequently grown through the application of impurity to thereon.

During the growth of the layers, (2-6), (2-7), and (2-8), as shown in FIG. 2, a poly-crystal or an amorphous silicon thin films, (2-6-1), (2-7-1) and (2-8-1), are formed at each sides thereof, respectively.

Thereafter, a siliside thin film (2-9) for a collector metal junction is formed, and a metal electrode (2-10) are then deposited to thereby obtain an element.

However, the above element suffers from a drawback that since a current path passing via a sequence of the amorphous silicon thin films, (2-8-1), (2-7-1) and (2-6-1), is occurred, it can be prone to a short between the collector and the emitter.

Likewise, current paths passing through a sequence of the amorphous silicon thin films, (2-8-1), (2-7-1), (2-6-1) and the n-type Si thin film (2-6), or a series of the thin film (2-6), the thin films, (2-7-1) and (2-6-1) may be occurred, in practice thereby causing an emitter-base and a base-collector shorts.

SUMMARY OF THE INVENTION

It is, therefore, a primary object of the present invention to provide a super self-aligned bipolar transistor and a method for manufacturing thereof which is capable of miniaturizing a size of element, and simplifying the fabricating process by employing a selective collector epitaxial growth, without designing a trench for isolating between elements, thereby enhancing the performance thereof.

In accordance with the present invention, there is provided a super self-aligned heterojuction bipolar transistor, which comprises a semiconductor substrate having a buried collector; a first oxidation film and a conducting thin film for a base electrode sequentially formed on the substrate; a collector surrounded by the conducting thin film and the first oxidation film and formed on the buried collector in an active region of the transistor defined by patterning the conducting thin film and the first oxidation film;

a first spacer formed at both sides of the conducting thin film surrounding the collector; a multi-layer base formed in the active region on the resulting structure; an emitter selectively growned on the base in an emitter region of the transistor defined by etching a second oxidation film; a second spacer formed at both sides of the second oxidation film surrounding the emitter; an emitter electrode formed on the emitter; a passivation insulating layer formed on an entire surface of the resulting structure; and a metallic interconnections formed on the base, the emitter electrode and the buried collector, passing through the passivation insulating layer, and the first and the second oxidation film, respectively.

In accordance with the present invention, there is provided a method for manufacturing a super self-aligned heterojunction bipolar transistor, which comprising the steps of: (a) forming sequently a first oxidation film, an electrically conducting thin film and a second oxidation film on top of a semiconductor substrate in which a buried is formed; (b) patterning the second oxidation film and the electrically conducting thin film, and forming a first spacer at sides of an exposed portion of the second oxidation film and the electrically conducting thin film; (c) removing an exposed first oxidation film, and selectively growing a collector thin film on a defined active region such that its height is approximately similar to that of the thin film for the base oxidation film; (d) forming a Si/SiGe layer with a heterojunction structure on a resulting structure obtained from said step (c); (e) exposing a portion of the first oxidation film by using a mask defining a base electrode, and forming a third oxidation film on a semifinished structure obtained from said step (d); (f) exposing a surface of the Si/SiGe layer by using a mask defining an emitter region, and forming a second spacer on sides of an etched portion; (g) growing selectively an emitter thin film in the emitter region; (h) forming an emitter electrode on the emitter thin film; and (i) performing a contact window opening and then metal wiring process.

Preferably, the semiconductor substrate is comprised of single silicon substrate, a heterojuction substrate being made of Si/SiGe/Ge, or a heterojuction substrate being made of Si/diamond/Si or Ge from the bottom to the top.

Preferably, the electrically conducting thin film for the base electrode in the step (a) is a p⁺-type poly-silicon which is doped by an in-situ doping.

In addition, the first spacer in the step (b) is preferably formed by double layer consisting of a silicon nitride film and a silicon oxidation film with different etching rate to thereby enhance the device performance thereof.

In the step (g), the multi-layer base is composed of Si/undoped SiGe/doped SiGe/Si heterojunction structure.

Likewise, the method after the step(g) includes the step of forming a silicide layer on top of the Si/SiGe layer, to thereby minimize a parasitic base resistance.

BRIEF DESCRIPTION OF THE DRAWINGS

The above and other objects and features of the present invention will become apparent from the following description of preferred embodiments, when taken in conjunction with the accompanying drawings, in which.

DETAILED DESCRIPTION OF THE PREFERRED EMBODIMENTS

Figure 3:
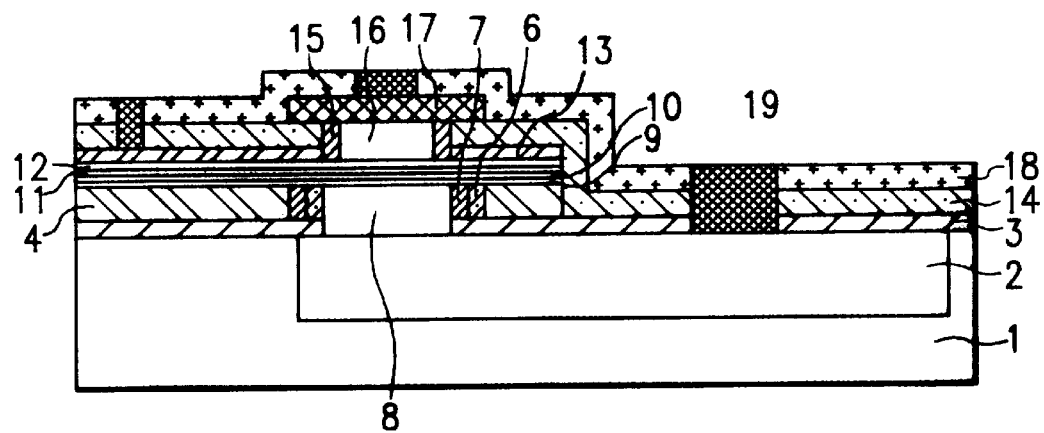
FIG. 3 explains a cross-sectional view of a super self-aligned bipolar transistor manufactured in accordance with a preferred embodiment the present invention.

There are shown in FIG. 3 a cross-sectional view of a super self-aligned bipolar transistor formed a selective collector growth method in accordance with a preferred embodiment the present invention.

Referring to FIG. 3, a buried collector 2 is first formed on a semiconductor substrate 1, and then a first oxide film 3 and a conducting thin film 4 for a base electrode are sequentially formed thereon. At this time, the semiconductor substrate 1 is preferably comprised of single silicon substrate, a heterojuction substrate being made of Si/ SiGe/ Ge, or a heterojuction substrate being made of Si/ diamond/ Si or Ge. Also, the above conducting thin film 4 is generally comprised of polysilicon of heavily doped any one of a high concentration.

Then, a collector layer 8 is formed at an active region of transistor defined by patterning the conducting thin film 4 and the first oxide film 3, and a first spacer is formed at both sidewalls of the conducting thin film 4 surrounding the collector layer 8. Preferably, the first spacer is formed either by double layer of silicon nitride film 6 and silicon oxide film 7.

On the above semi-finished structure, a base layer and a second oxide film 14 are sequentially formed. The base layer is preferably comprised of a double-layer being made of Si/SiGe, or multi-layer structure being made of Si 9/undoped SiGe 10/doped SiGe 11/Si 12. At this time, a silicide layer 13 is further comprised between the base layer and the second oxide film 14, to decrease parasitic base resistance thereof.

An emitter layer 16 is selectively grown in an emitter region defined by etching the second insulating film 14 which is preferably a silicon oxide film and/or the silicide layer 13, and a second spacer 15 is formed at both sidewalls of the second oxide film 14 and the silicide layer 13 surrounding the emitter layer 16. An emitter electrode 17 is formed on the emitter layer 16. A passivation oxide layer 18 is deposited on the above semi-finished structure, and then a metallic interconnections 19 are formed on the base layer, the emitter electrode 17 and the buried collector 2 through the passivation oxide layer 18 and the first and second oxide layers 3, 14.

In comparison with the above-mentioned methods( see, FIGS. 1 and 2), details of advantages of the present invention will be illustrated below with reference to FIG. 3.

Figure 1:
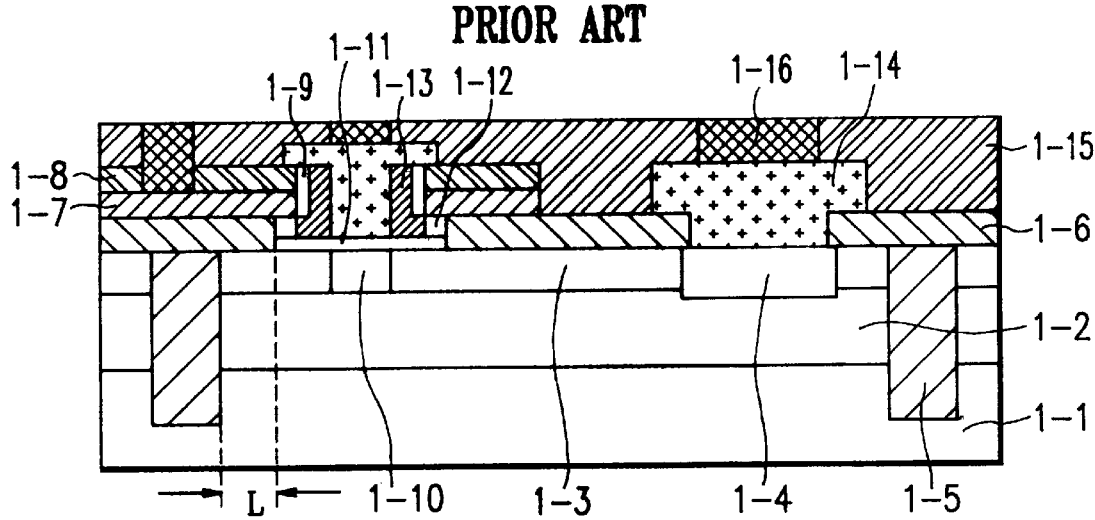
FIG. 1 shows a cross-sectional view of a super self-aligned npn Si/SiGe heterojunction bipolar transistor which utilizes the selective base epitaxial growth method previously described.

Firstly, a trench structure to isolate between elements should be deeply formed so as to prevent the collector junction portion (1-4) from contacting with elements through the n⁻ Si collector layer (1-3), in the n⁺ buried Si collector layer (1-2) deposited on the entire surface of the substrate, as shown in FIG. 1.

Figure 2:
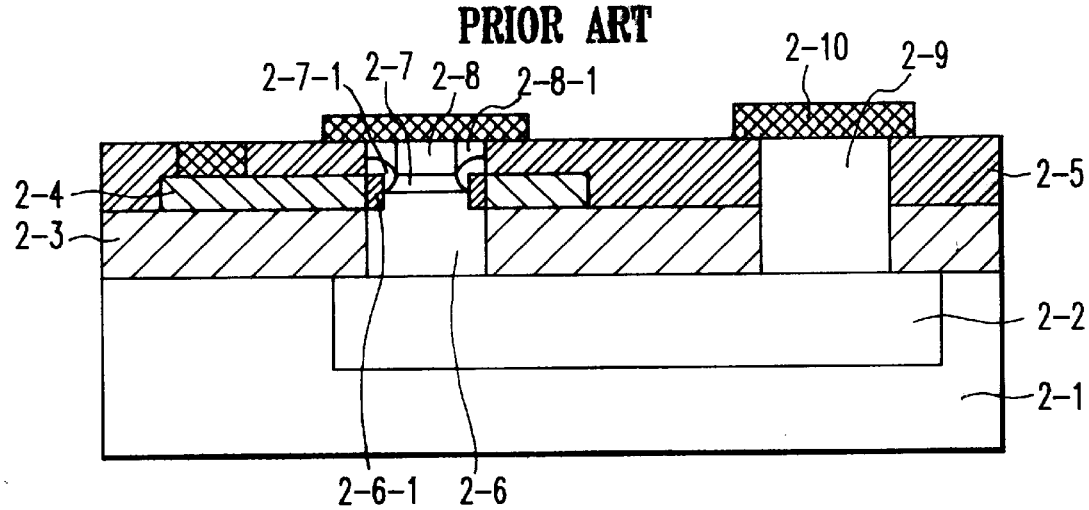
FIG. 2 offers a cross-sectional view of heterojunction bipolar transistor which self-aligned between collector and base by using another methods previously described.

As a result, a plane area for filling with the BPSG insulating thin film (1-5) is increased to thereby entail a bulkier element but, since each of the collector thin film (2-6) and a collector thin film 8 is separated from each other by the aid of the insulating thin film (2-3) and 3, as shown in FIGS. 2 and 3, respectively, the trench process to isolate between elements in FIG. 1 may be eliminated.

Likewise, since each of self-alignments of base-collector and emitter-base are performed so that all of the emitter, the base and the collector has the same area each other, it is possible to switch upward/downward operating modes, thereby making it to reduce a parasitic capacity between the base and the collector, and to self-align between the emitter and the base. Thus, cancellation of a process for isolating between elements results in a smaller element and further a simplified process step.

Secondly, in FIGS. 2 and 3, an useless region in FIG. 1 (which is indicated by length L) is eliminated to miniaturize a size of the element, resulting in a possibility of high integration and a reduction of parasitic capacity causing between an n⁺ buried collector and a p-type substrate, thereby making it possible to enhance an operating speed of the element.

In the order hand, in comparison with the element shown in FIG. 2, merits of the element shown in FIG. 3 will be discussed below.

Firstly, in case the element presented in FIG. 2, since a current path passing via a sequence of the amorphous silicon thin films, (2-8-1), (2-7-1) and (2-6-1), is occurred, it can be prone to a collector—emitter short effect relating not to a leakage current.

Similarly, since a current path passing through a sequence of the amorphous silicon thin films, (2-8-1), (2-7-1), (2-6-1) and the n-type silicon thin film (2-6), or a series of the n-type silicon thin films, (2-6), (2-7-1) and (2-6-1) is occurred, an emitter-base and a base-collector short effects may be occurred. In consequence, in practice the element associated with the structure shown in FIG. 2 is difficult to accomplish.

Furthermore when the n-type silicon thin film (2-6), i.e., collector thin film, is selectively grown, since the thin film (2-6-1) is grown from sides of the collector thin film (2-6), the thicker the thickness of the collector thin film (2-6) is the more increase the growth of the thin film (2-6-1) in sides thereof is. As a result, a sequence of simple-crystal thin films, (2-8), (2-7), (2-6) and (2-2), to be defined as an active region in the element may not be clearly determined.

In addition to the growth of both of the SiGe thin film (2-7) and the silicon thin film (2-8), since the thin films, (2-7-1) and (2-8-1), are also grown, a width of the active region in the element depends on a thickness of a sequence of the thin films, (2-6), (2-7) and (2-8), in actual.

In contrast to the element disclosed previously, the element in accordance with the present invention prevents a poly-crystalline thin film from growing by situating a first spacer 6 and/or 7, between a polysilicon thin film 4 for a base electrode and a selectively grown collector layer 8, thereby allowing it possible to clearly define the active region in the element as defined by a mask.

According to the invention, isolation between an emitter layer 16 and the poly-crystal thin films is derived by using a mask defining an emitter region and a second spacer 15. Thus, the invention can be less prone to a flow of leakage current or an emitter-base-collector short effect.

Secondly, when a single p-type SiGe thin film is used as a base as shown in FIG. 2, a p-type impurity within the base thin film, during the growth of the emitter layer (2-8), may be diffused to the collector and the emitter adjacent to the base, respectively.

Thus, discordance between a junction face of a sequence of the emitter thin film (2-8), the SiGe base thin film (2-7) and the n-type silicon collector thin film (2-6), i.e., a sequence of emitter-base-collector, and a junction face by the npn impurity is occurred. As a result, a parasitic electric potential is created at the junction faces between the emitter—the base and between the collector—the base, hence, the parasitic electric potential prevents an electron from transferring from the emitter to the collector, thereby making it to degrade performance factors of the element such as a current amplification factor and a cutoff frequency and so on.

Conversely, in the present invention, in order to overcome the degradation of the performance factors depending on generation of such parasitic electric potential, the base layer has multi-layer structure being made of a Si 9, an undoped SiGe 10, a SiGe 11 doped a p-type impurity in-situ and 25 Si 12.

Thirdly, in the prior art element, since a thickness of the collector thin film in a high speed element is thinly designed, a thickness of the base electrode film (2-4) in FIG. 2 thin so that a parasitic resistance resulting from the base electrode film (2-4) is further increased, but the present invention provides a silide layer 13 to minimize the parasitic resistance as shown in FIG. 3.

Fourthly, in order to a high speed of element when a thickness of the collector thin film (2-6) is decreased, that of the insulating thin film (2-3) should be also decreased, thus entailing a reduction of breakdown voltages between the thin film (2-4) and the thin film (2-6-1) and between the thin film (2-4) and the collector thin film (2-6). In accordance with the present invention, even though a thickness of the collector layer 8 is decreased depending on the first spacer, 6 and 7, the breakdown voltage between the base layer 4 and the collector layer 8 is not decreased.

Fifth, in the structure shown in FIG. 2, since a selective epitaxial growth process to grow the SiGe thin film (2-7) is used, it has a shortcoming that it difficult to manufacture thereof and it has cumbersome processes, thereby degrading overall productivity. In addition, the prior art structure causes the increment of parasitic resistance owing to a junction between the base electrode (2-4) and the base thin film (2-7) is performed at sides thereof.

In accordance with the present invention, the selective epitaxial growth for a base is not required, resulting in the reduction of processing time and further a contact between the multi-layer thin film for the base on the conducting thin film 4 for the base electrode, to thereby prevent the parasitic resistance in the base thin film from increasing.

As described hereinabove, in accordance with a preferred embodiment present invention, it is possible to cope with the above disadvantages according to the elimination of element isolation region in a chip and an ion implantation, and to facilely control the parasitic capacity causing between the collector and the base, and further to remarkably reduce the parasitic capacity between the emitter and the base and the parasitic resistance in the base through a self-alignment between the base and the emitter, thereby improving an operating characteristics of element in a high frequency bandwidth.

Hereinafter, the manufacturing method of a super self-aligned bipolar transistor in accordance with the present invention will be described with reference to FIGS. 4(A) to 4(I).

Figure 4A:
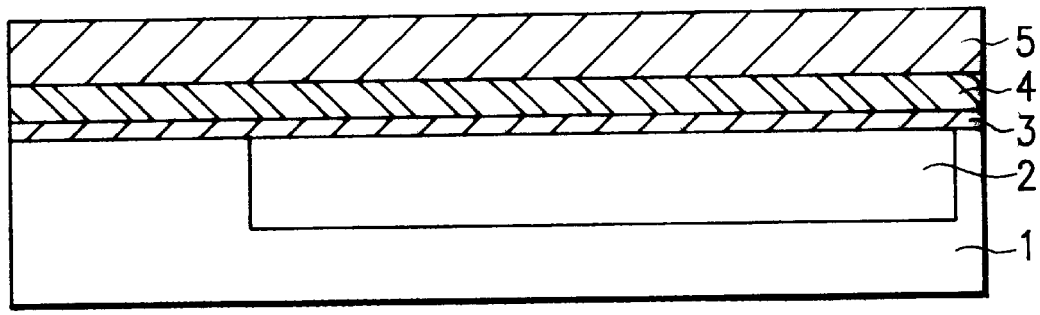
FIGS. 4(A) to 4(I) exhibit a schematic cross-sectional views setting forth the manufacturing steps for the super self-aligned bipolar transistor in accordance with a preferred embodiment the present invention.

Referring to FIG. 4(A), there are shown a p-type semiconductor substrate 1 having a n type buried collector 2. The semiconductor substrate 1 is preferably comprised of a single silicon substrate as shown in FIG. 4(A). Also, the substrate can be comprised of a heterojuction substrate being made of Si/SiGe/Ge, or being made of Si/diamond thin film/Si or Ge. The above buried collector 2 is generally formed by photolithography, ion implantation and annealing process.

Next, a first silicon oxidation film 3 is deposited thereon.

Subsequently, a p-type conducting thin film 4 for a base electrode such as polysilicon, poly-SiGe and poly-Ge which are doped by using a chemical vapor deposition(CVD) method followed an impurity ion implantation. Thereafter, a second silicon oxidation film 5 is deposited on the conducting thin film 4.

Figure 4B:
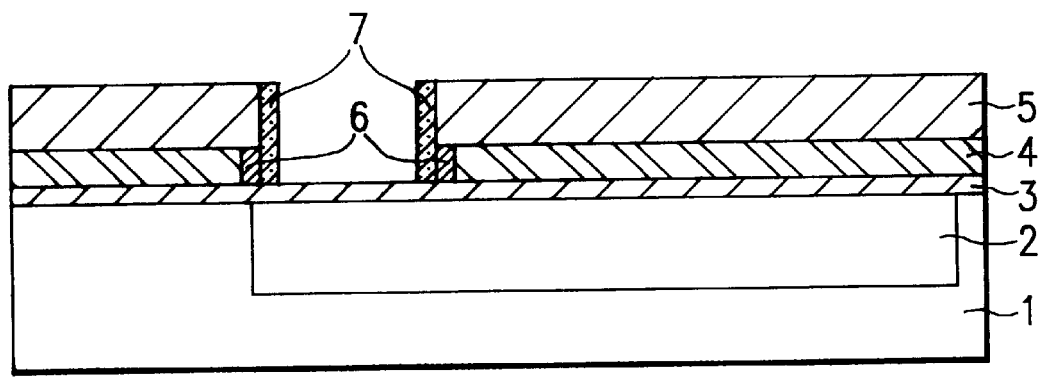

Turning to FIG. 4(B), the second silicon oxidation film 5 is etched by using a photoresist mask defining an active region in the element, and then the photoresist is removed.

In an ensuing step, the conducting thin film 4 is wet etched to form an undercut portion, and then thermal oxide layer 6 for a first spacer formation is formed by thermal oxidation in the undercut portion of the conducting film 4, a silicon nitride film 7 for the first spacer is then deposited thereon.

Thereafter, the silicon nitride film 7 is remained only sides thereof by using an anisotropic dry etching.

Figure 4C:
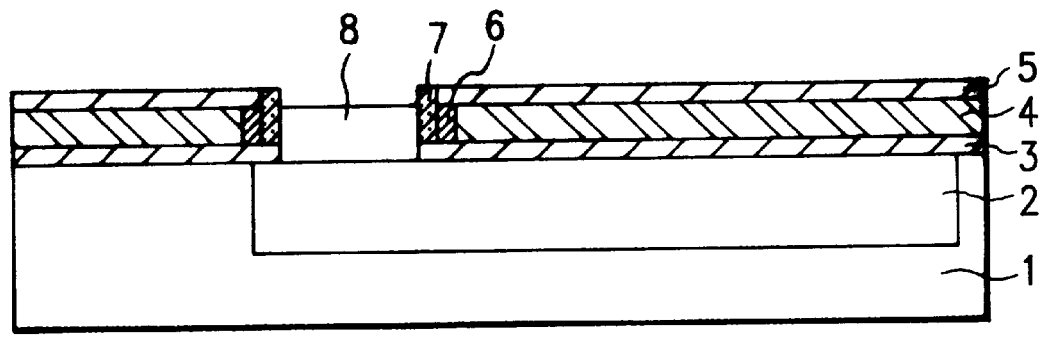

Referring to FIG. 4(C), the first oxide layer 3 is further etched, wherein the second oxide layer 5 is also etched same as the etched thickness of first oxide layer 3, and a single crystal silicon collector layer 8 is selectively grown on the exposed buried collector 2.

In this moment, the single crystal thin film 8 is doped by adding an n-type impurity or an ion implantation and the heat treatment after the growth of the thin film.

Figure 4D:
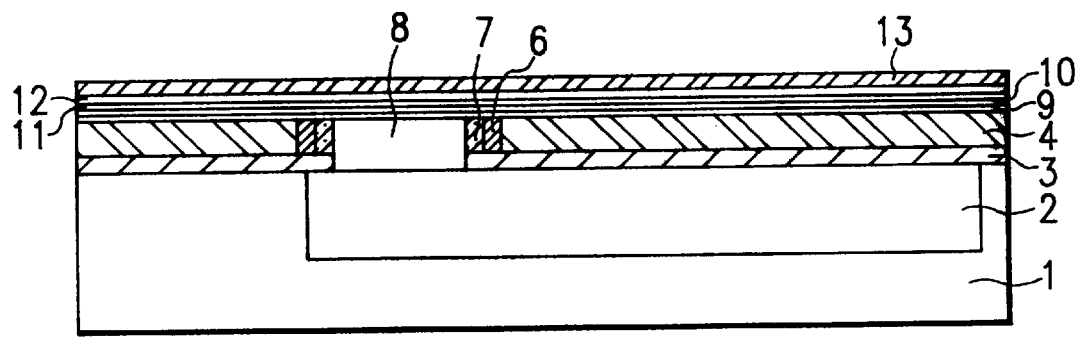

Referring to FIG. 4(D), the second silicon oxidation film 5 is etched. In this occasion, the silicon nitride film 7 is wet etched as a thickness of the silicon oxidation film 5. At this time, the thermal oxidation process further protects a surface of the single crystal thin film from the above etching process.

Thereafter, heterojunction base layers are formed, that is, a silicon thin film 9, an undoped SiGe thin film 10, a SiGe thin film 11 doped with a p-type impurity in-situ and a silicon thin film 12 is sequently grown on exposed p-type polycrystal silicon thin film 4 and the single crystal thin film 8.

In the above step, an impurity addition to the SiGe thin film 10 is performed when the SiGe thin film is epitoxially grown in-situ and an impurity addition to the silicon film 12 is any one of the n-type or the p-type impurities.

In addition, the thin films, 10 and 11, or all of the thin films, 10, 11 and 12, may be replaced with a doped p-type silicon thin film doped in-situ, the exception of the silicon thin film 9. In the above step a polycrystalline thin film is grown on the polysilicon thin film 4, and the first spacer 6 and/or 7 while the single-crystalline thin film is grown on the single crystal thin film.

Additionally a metal or a metallic siliside for example, a titanium siliside, $TiSi_{2-X}$ (X is O to 9) 13 is deposited on the top layer 12 of the base sputtering.

Figure 4E:
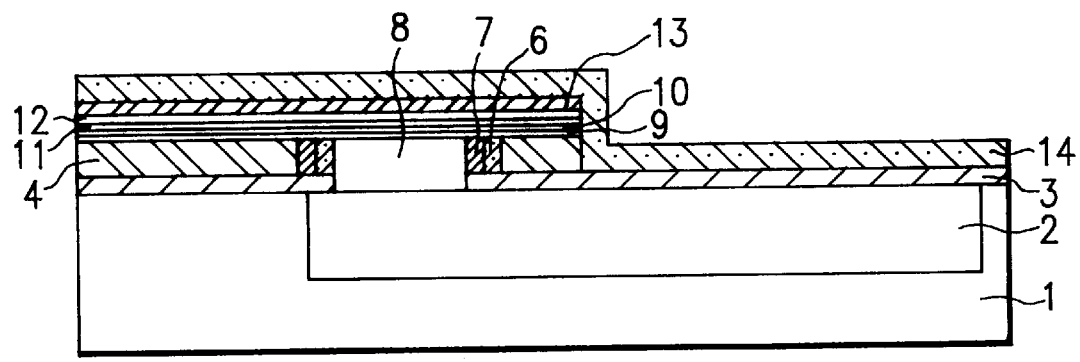

Referring to FIG. 4(E), a non-active region of the transistor that is, the silicide layer 13, polycrystalline base layers 12-9, and the polysilicon layer 4 are etched by using as a mask defining a base electrode, and then a silicon oxidation film 14 is deposited thereon.

Figure 4F:
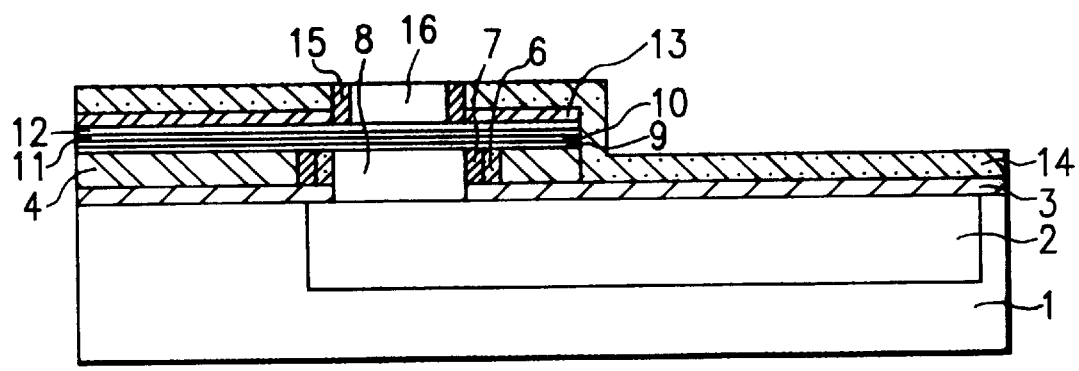
Figures 1, 4F:
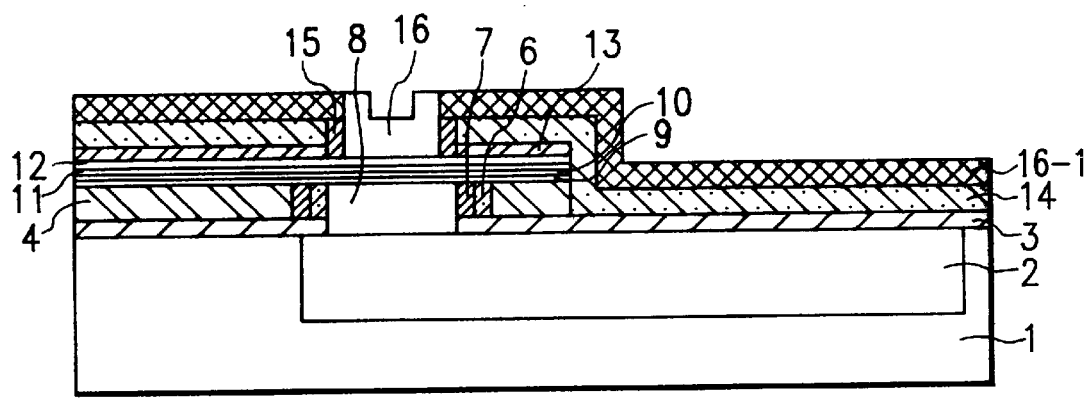

Referring to FIG. 4(F), the silicon oxidation film 14 and the silicide layer 13 are etched by using a photoresist pattern as a mask defining an emitter region.

Next, a silicon oxide is deposited thereon, and a second spacer 15 is formed on both sides of the silicide 13 and the silicon oxidation film 14 by using anisotropic etching.

Subsequently, an n-type silicon thin film 16 for an emitter doped in-situ is deposited at the silicon oxidation film 15.

Referring to FIG. 4(F-1), the n-type silicon thin film 16 for the emitter doped in-situ is entirely deposited in contrast to the structure shown in FIG. 4(F).

Figure 4G:
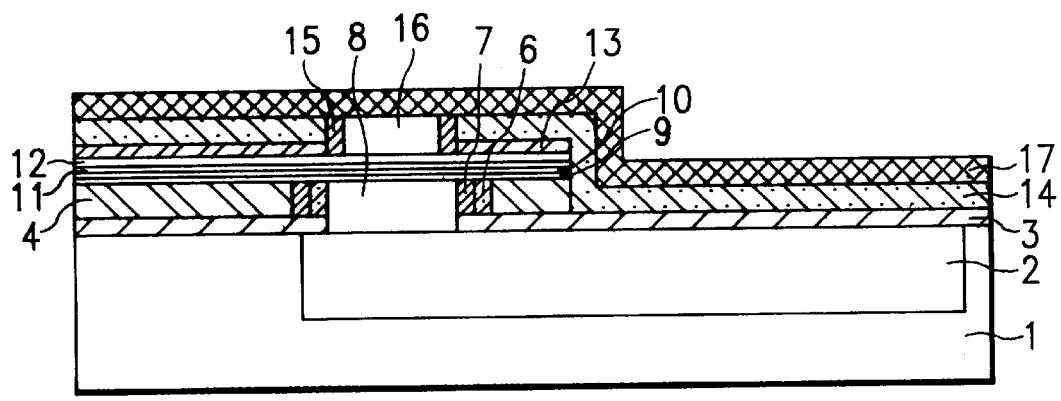
Figures 1, 4G:
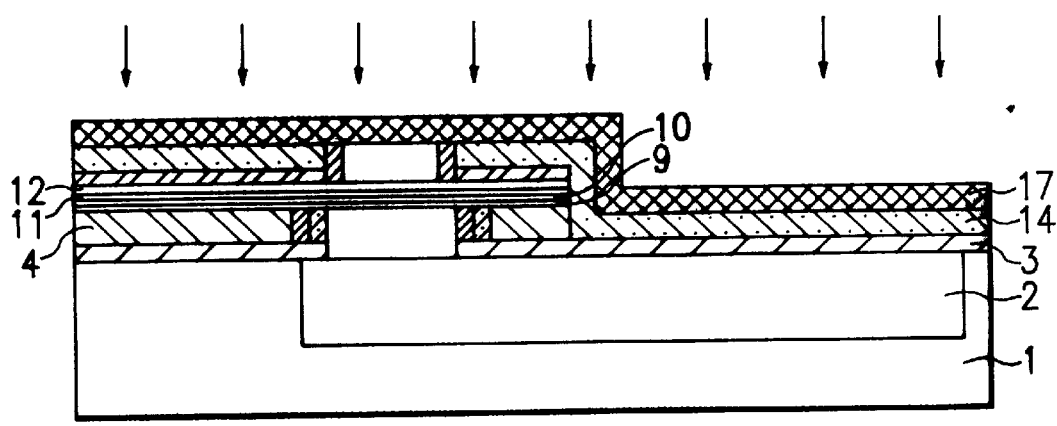

Referring to FIG. 4(G), after the structure shown in FIGS. 4(F) and 4F-1, the polysilicon thin film 17 is deposited by adding a doped n-type impurity in-situ, or as shown in FIG. (G-1) undoped polysilicon thin film 17 is deposited and then doped, the n-type polysilicon film 17 can be by ion implanting the n-type impurity.

Figure 4H:
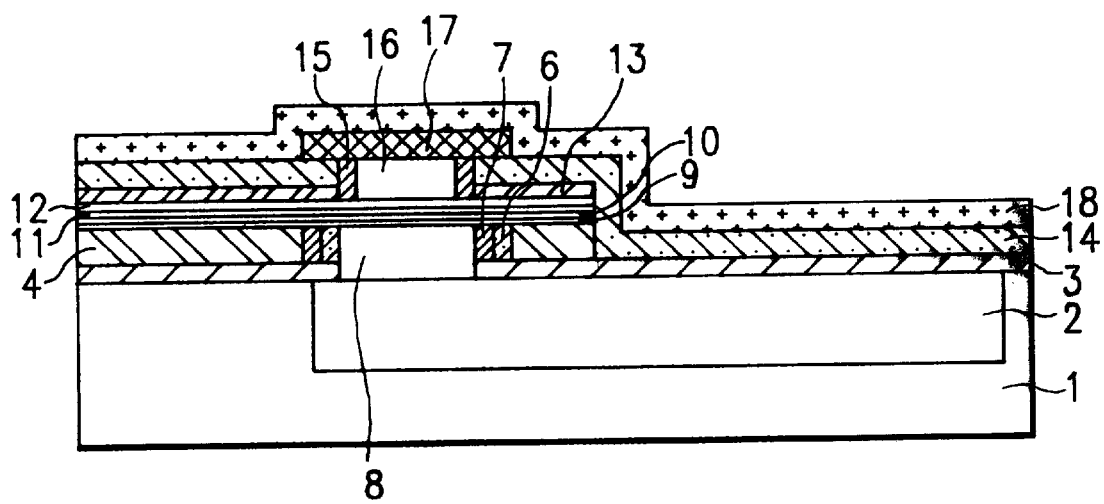

Referring to FIG. 4(H), a polysilicon emitter electrode 17 is patterned by using a photoresist pattern, and then the photoresist pattern is removed. Thereafter, a passivation insulating layer 18 is deposited.

Figure 4I:
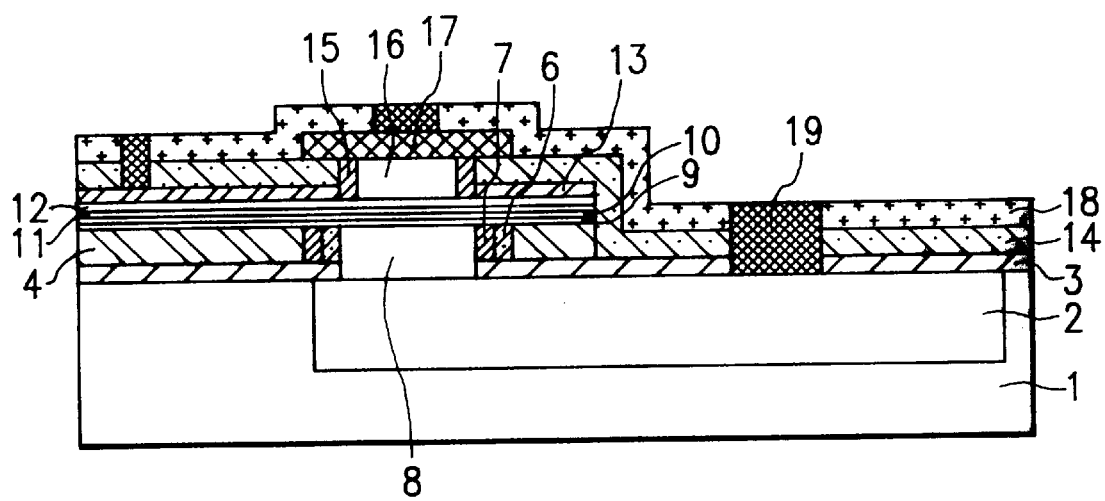

Referring to FIG. 4(I), metallic interconnections 19 are formed on the base layer or the silicide layer 12, the emitter electrode 17 and the buried collector 2 through the passivation oxide layer 18 and/or the first and second oxide layers 3, 14.

As mentioned above, the present invention has an advantage that an operating speed of bipolar transistor can be increased using a Si/SiGe heterojunction thin film structure, and a parasitic capacity and a parasitic resistance of elements are reduced and an element is miniaturized, to thereby accomplish a high speed, a high integration and a low power consumption.

Furthermore, the invention has a merit that when it is a high speed element reduction effect of a breakdown voltage between a collector and a base or between a collector and an emitter depending on decrement of a thickness of the collector is minimized, and it is easier to manufacture thereof, to thereby enhance productivity of element.

While the present invention has been described with respect to certain preferred embodiments only, other modifications and variations may be made without departing from the scope of the present invention as set forth in the following claims.

What is claimed is:

1. A method for manufacturing a super self-aligned heterojunction bipolar transistor, which comprising the steps of:
    (a) forming sequently a first oxidation film, a conducting thin film for a base electode and a second oxidation film on top of a semiconductor substrate formed a buried collector;
    (b) patterning the second oxidation film and the conducting thin film, and forming a first spacer at sides of an exposed portion of the second oxidation film. and the conducting thin film;
    (c) removing an exposed first oxidation film, and selectively growing a collector thin film on a defined active region such that its height is approximately similar to that of the conducting thin film for the base electrode;
    (d) growing a muti-layer base with a heterojunction structure on a semifinished structure obtained from said step(c);
    (e) exposing a portion of the first oxidation film by using a mask defining the base electrode, and forming a third oxidation film on a above semifinished structure;
    (f) exposing a top of the multi-layer base by using a mask defining an emitter region, and forming a second spacer on sides of an etched portion;
    (g) growing selectively an emitter layer on the emitter region to be defined from the steps;
    (h) forming an emitter electrode on the emitter layer; and
    (i) performing a metal wiring process.
2. The method of claim 1, wherein the semiconductor substrate is composed of a single silicon substrate, a heterojuenction substrate being made of Si/SiGe/Ge, or a heterojunction substrate being made of Si/diamond/Si.
3. The method of claim 1, wherein the conducting thin film for the base electrode is a $P^+$-type polysilicon doped an impurity in-situ.
4. The method of claim 1, wherein the first spacer is formed by double layer consisting of a silicon nitride film and a silicon oxide film with different etching rate to thereby enhance the performance thereof.
5. The method of claim 1, wherein the multi-layer base is comprised of Si/undoped SiGe/doped SiGe/Si heterojunction structure, to thereby prevent the degradation of the performance of element due to occurrence of a parasitic electric potential.
6. The method of claim 1, which after the step (d) includes: forming a siliside layer on top of the multi-layer base, to thereby minimize a parasitic resistance in the base.
7. A method for manufacturing a self-assigned heterojunction bipolar transistor comprising the steps of: (a) forming sequentially a first oxidation film, an electrically conducting thin film and a second oxidation film on top of a semiconductor substrate in which a buried collector is formed; (b) patterning the second oxidation film and the electrically conducting thin film, and forming a first spacer at sides of an exposed portion of the second oxidation film and the electrically conducting thin film; (c) removing an exposed first oxidation film, and selectively overgrowing a collector thin film on a defined active region; (d) removing the second insulating film and the first oxidation film; (e) forming a Si/SiGe layer with a heterojunction structure and a metallic base electrode layer on a resulting structure obtained from step (d); (f) exposing a portion of the first oxidation film by using a mask defining a base electrode, and forming a third oxidation film on a semifinished structure obtained from said step (e); (g) exposing a surface of the Si/SiGe layer by using a mask defining an emitter region, and forming a second spacer on sides of an etched portion; (h) growing selectively an emitter film in the emitter region; (i) forming an emitter electrode on the emitter thin film; and (j) performing a metal wiring process.
8. The method of claim 7, wherein the semiconductor substrate is composed of a single silicon substrate, a heterojunction substrate being made of Si/SiGe/Ge from the bottom to the top, or a heterojunction substrate being made of Si/diamond/Si or Ge from the bottom to the top.
9. The method of claim 7, wherein the first insulating film is formed by either a single layer of a silicon nitride film or a double layer consisting of a silicon oxide film on the bottom and a silicon nitride film on the top.
10. The method of claim 7, wherein the conducting thin film for the base electrode is a $p^+$-type polysilicon, a which is doped by either an in-situ doping or a dopant implantation.
11. The method of claim 7, wherein the first spacer is a silicon nitride film.
12. The method of claim 7, wherein the first spacer is formed by a double layer consisting of a silicon oxide film at on side of the conducting film for the base electrode and a silicon nitride film at another side of the conducting film.
13. The method of claim 7, wherein the collector thin film is made of either silicon or germanium.
14. The method of claim 7, wherein the multi-layer base is comprised of Si/undoped SiGe/doped SiGe/Si heterojunction structure, to thereby prevent the degradation of performance due to occurrence of a parasitic electric potential.
15. The method of claim 7, wherein the metallic base electrode layer is made of a silicide layer on top of the multi-layer base.

* * * * *